US011075267B2

(12) United States Patent
Chou et al.

(10) Patent No.: US 11,075,267 B2
(45) Date of Patent: Jul. 27, 2021

(54) SEMICONDUCTOR DEVICE WITH LOW RANDOM TELEGRAPH SIGNAL NOISE

(71) Applicant: TAIWAN SEMICONDUCTOR MANUFACTURING COMPANY LTD., Hsinchu (TW)

(72) Inventors: Kuo-Yu Chou, Hsinchu (TW); Seiji Takahashi, Hsinchu (TW); Shang-Fu Yeh, Hsin Chu (TW); Chih-Lin Lee, Miaoli County (TW); Chin Yin, Tainan (TW); Calvin Yi-Ping Chao, Zhubei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 43 days.

(21) Appl. No.: 16/716,299

(22) Filed: Dec. 16, 2019

(65) Prior Publication Data

US 2020/0119144 A1    Apr. 16, 2020

Related U.S. Application Data

(63) Continuation of application No. 15/965,610, filed on Apr. 27, 2018, now Pat. No. 10,510,835.

(51) Int. Cl.
| | |
|---|---|
| *H01L 29/06* | (2006.01) |
| *H01L 29/78* | (2006.01) |
| *H01L 29/10* | (2006.01) |
| *H01L 29/08* | (2006.01) |
| *H01L 21/762* | (2006.01) |
| *H01L 21/308* | (2006.01) |

(52) U.S. Cl.
CPC ...... *H01L 29/0649* (2013.01); *H01L 21/3086* (2013.01); *H01L 21/762* (2013.01); *H01L 29/0856* (2013.01); *H01L 29/0873* (2013.01); *H01L 29/1033* (2013.01); *H01L 29/7801* (2013.01)

(58) Field of Classification Search
CPC ............... H01L 21/3086; H01L 21/762; H01L 29/0649; H01L 29/0856; H01L 29/0873; H01L 29/1033; H01L 29/7801
USPC ........................................................ 257/401
See application file for complete search history.

(56) References Cited

U.S. PATENT DOCUMENTS

| | | | | |
|---|---|---|---|---|
| H1435 H | * | 5/1995 | Cherne | .................... 257/347 |
| 2016/0064446 A1 | * | 3/2016 | Lee | ............... H01L 27/1463 |
| | | | | 250/208.1 |

* cited by examiner

*Primary Examiner* — Igwe U Anya
(74) *Attorney, Agent, or Firm* — WPAT, P.C., Intellectual Property Attorneys; Anthony King

(57) ABSTRACT

A semiconductor device comprises a source/drain diffusion area, and a first doped region. The source/drain diffusion area is defined between a first isolation structure and a second isolation structure. The source/drain diffusion area includes a source region, a drain region, and a device channel. The device channel is between the source region and the drain region. The first doped region is disposed along a first junction between the device channel and the first isolation structure in a direction from the source region to the drain region. The first doped region is separated from at least one of the source region and the drain region, and has a dopant concentration higher than that of the device channel. The semiconductor device of the present disclosure has low random telegraph signal noise and fewer defects.

20 Claims, 16 Drawing Sheets

US 11,075,267 B2

SEMICONDUCTOR DEVICE WITH LOW RANDOM TELEGRAPH SIGNAL NOISE

PRIORITY CLAIM AND CROSS-REFERENCE

The present application is a continuation application of U.S. patent application Ser. No. 15/965,610 filed on Apr. 27, 2018, which is incorporated herein by reference in its entirety.

BACKGROUND

In the semiconductor industry, the technology continues to improve the integration density of various electronic components by continual reductions in minimum feature size, which allow more components to be integrated into an area. While integration density increases, however, random telegraph signal (RTS) noise becomes more serious in semiconductor devices, such as metal oxide semiconductor field effect transistors (MOSFETs). Thus, semiconductor devices with relatively low RTS noise are required to solve the problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

DETAILED DESCRIPTION

Figure 1B:
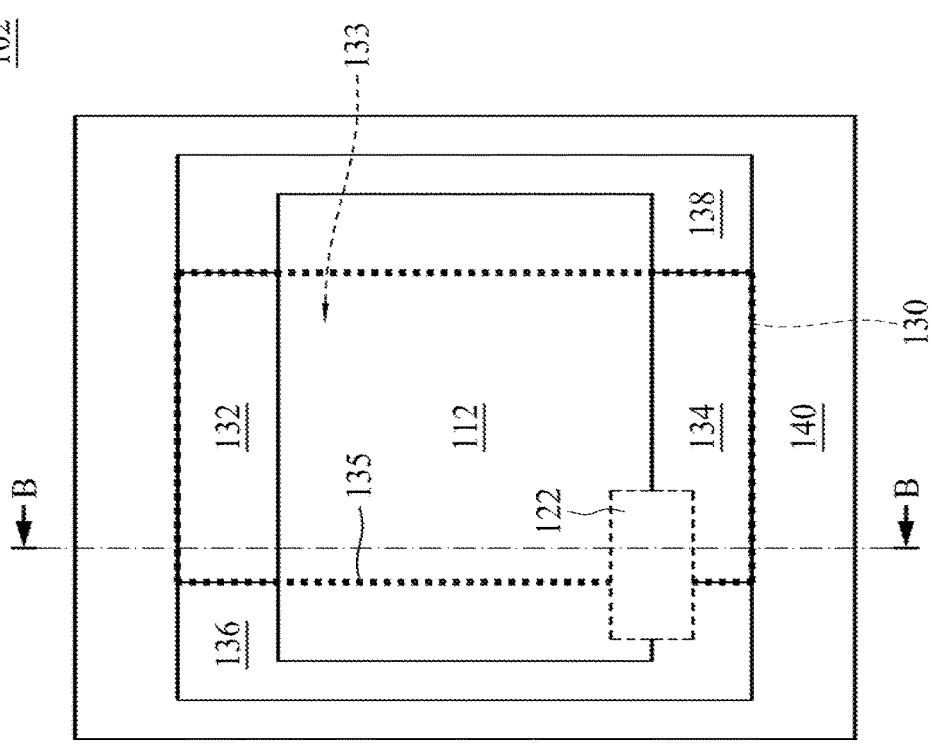
FIGS. 1A-1D are top views of semiconductor devices in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure aims to provide semiconductor devices with low random telegraph signal (RTS) noise and fewer defects. To reduce random telegraph signal noise while causing fewer defects, at least one doped region is formed along a junction between a device channel and an isolation structure without overlapping both of a source region and a drain region.

Figure 1A:
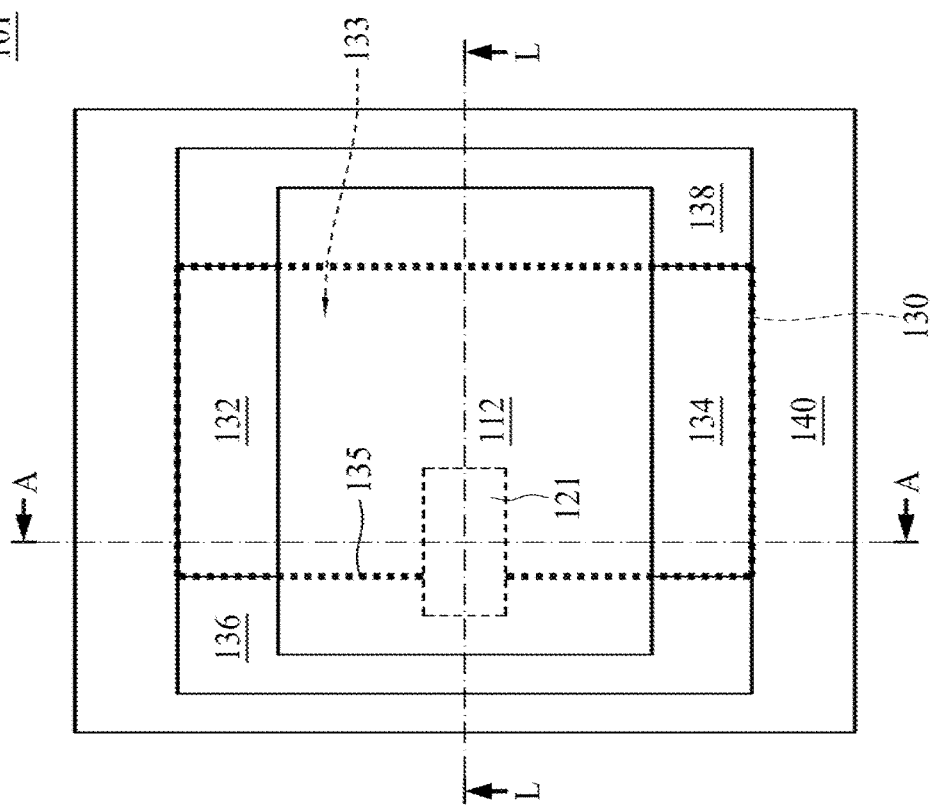

FIG. 1A is a top view of a semiconductor device 101 in accordance with an embodiment of the present disclosure. The semiconductor device 101 may include a transistor, for example, a metal-oxide-semiconductor field effect transistor (MOSFET).

Referring to FIG. 1A, the semiconductor device 101 includes a first isolation structure 136, a second isolation structure 138, a source/drain diffusion area 130, a doped region 121, and a gate 112. The source/drain diffusion area 130 is defined between the first isolation structure 136 and the second isolation structure 138. The gate 112 is disposed over the source/drain diffusion area 130. The source/drain diffusion area 130 includes a source region 132, a drain region 134, and a device channel 133 in a substrate 140. The device channel 133 is disposed under the gate 112 and between the source region 132 and the drain region 134.

The first and second isolation structures 136, 138, such as shallow trench isolation (STI) regions, function to electrically isolate the semiconductor device 101 from other semiconductor devices. Persons having ordinary skill in the art will understand that the source/drain diffusion area 130 is surrounded by isolation structures. For brevity, only the first isolation structure 136 and the second isolation structure 138 extending in parallel with each other are shown.

The doped region 121 is disposed along a first junction 135 between the device channel 133 and the first isolation structure 136 in a direction from the source region 132 to the drain region 134. The direction, for example, is in parallel with the direction AA shown in FIG. 1A. The doped region 21 includes semiconductor materials of a first dopant type, while the source region 132 and the drain region 134 include semiconductor materials of a second dopant type. The first dopant type and the second dopant type are different from each other. In an embodiment, the semiconductor device 101 includes an n-type MOS (NMOS) transistor, and the doped region 21 includes p-type dopants such as boron or boron difluoride ($BF_2$) having a concentration of 1e17-1e19/$cm^3$. In another embodiment, the semiconductor device 101 includes a p-type MOS (PMOS) transistor, and the doped region 21 includes n-type dopants such as arsenic, phosphorus, or antimony having a concentration of 1e17-1e19/$cm^3$.

In semiconductor devices, stress may be present between different materials. In the present case, stress may be induced at the junction between a dielectric-material STI and a semiconductor-material device channel, resulting in defects due to crystalline dislocation or distortion. Such defects create trap sites that may exist in an interface between silicon and gate oxide. Most of trap sites are located close to STI. Charge trapping and de-trapping in the trap sites incur current fluctuation. Specifically, a single trap site may cause RTS noise, while multiple trap sites may cause flicker noise.

The doped region 121 causes an increase in threshold voltage at which the doped region 121 is disposed. Since current, when flows from source to drain or vice versa, is inclined to flow through a lower threshold region than a higher one, the doped region 121 can reduce a current flowing near the first isolation structure 136 and hence reduce an average current density distributed along the first isolation structure 136. Effectively, the doped region 124 alleviates the problem of current fluctuation. Further, the doped region 121 may cause fewer defects since the doped region 121 is disposed along only a part of the first junction 135 rather than a full length of the first junction 135.

For an NMOS transistor, the device channel 133 includes p-type impurity as the substrate 140. The concentration of p-type dopants in the doped region 121 is higher than that that in the device channel 133. Similarly, for a PMOS transistor, the device channel 133 includes n-type impurity as the substrate 140. The concentration of n-type dopants in the doped region 121 is higher than that that in the device channel 133. As a result, most of the current flows towards the device channel 133 instead of the doped region 121 because the doped region 121 has a higher threshold voltage.

In the embodiment of FIG. 1A, the doped region 121 overlaps both of the device channel 133 and the first isolation structure 136. However, the doped region 121 in the device channel 133 contributes to noise alleviation, and the doped region 121 in the first isolation structure 136 does not. In another embodiment, the doped region 121 may only overlap the device channel 133. The doped region 121 is separated from the source region 132 and the drain region 134, and thus overlaps neither the source region 132 nor the drain region 134.

FIG. 1B is a top view of a semiconductor device 102 in accordance with another embodiment of the present disclosure. Referring to FIG. 1B, the semiconductor device 102 is similar to the semiconductor device 101 described and illustrated with reference to FIG. 1A except that, for example, the position of a doped region 122 of FIG. 1B is different from the position of the doped region 121 of FIG. 1A. In the embodiment of FIG. 1B, the doped region 122 disposed along the first junction 135 overlaps the drain region 134, and is separated from the source region 132.

Figure 1D:
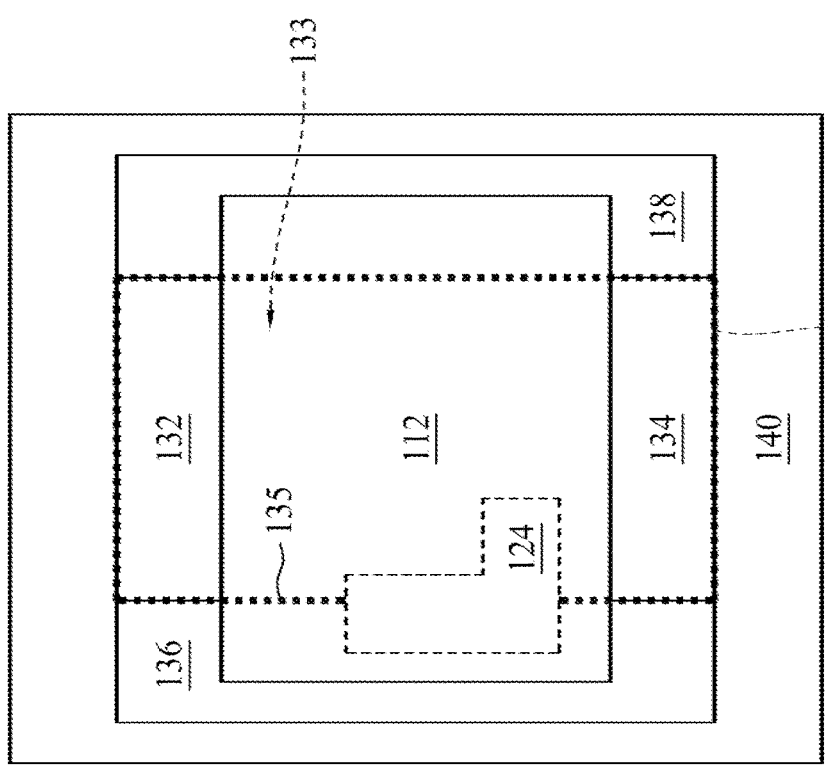
Figure 1C:
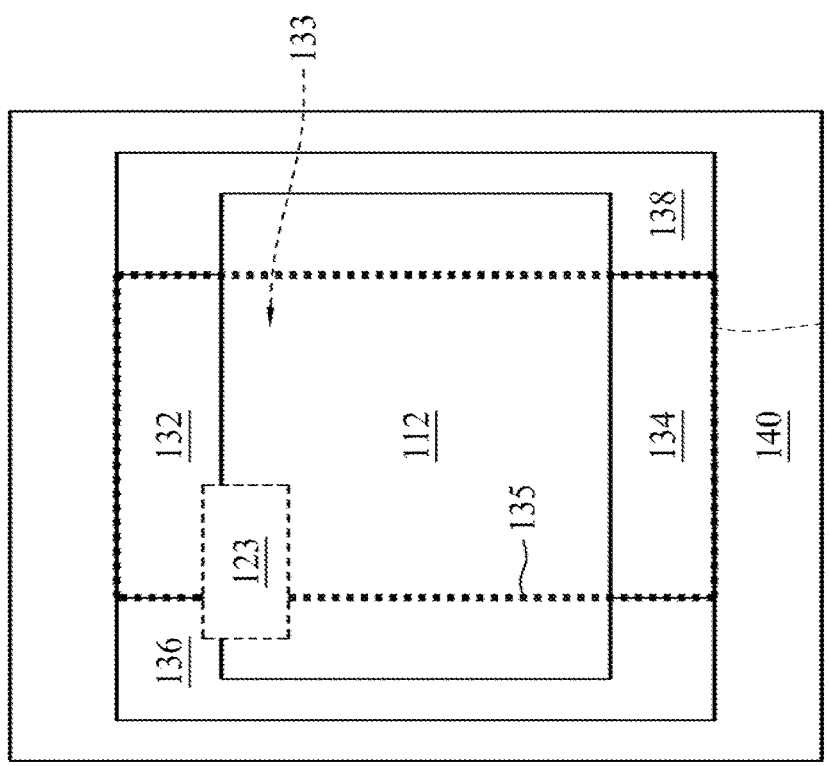

FIG. 1C is a top view of a semiconductor device 103 in accordance with yet another embodiment of the present disclosure. Referring to FIG. 1C, the semiconductor device 103 is similar to the semiconductor device 101 described and illustrated with reference to FIG. 1A except that, for example, the position of a doped region 123 of FIG. 1C is different from the position of the doped region 121 of FIG. 1A. In the embodiment of FIG. 1C, the doped region 123 disposed along the first junction 135 overlaps the source region 132, and is separated from the drain region 134.

FIG. 1D is a top view of a semiconductor device 104 in accordance with still another embodiment of the present disclosure. Referring to FIG. 1D, the semiconductor device 104 is similar to the semiconductor device 101 described and illustrated with reference to FIG. 1A except that, for example, the size or shape of a doped region 124 of FIG. 1D is different from the size or shape of the doped region 121 of FIG. 1A. In the embodiment of FIG. 1D, the doped region 124 disposed along the first junction 135 is L-shape. In addition, the size of the doped region 124 is larger than that of the doped region 121 of FIG. 1A.

Figure 2:
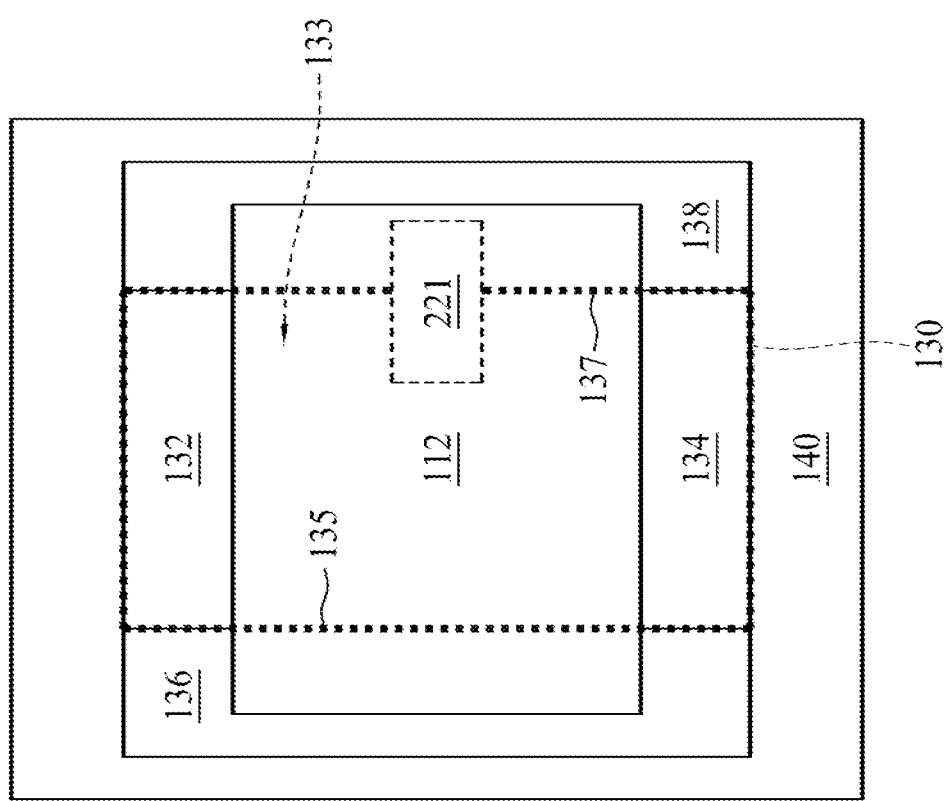
FIG. 2 is a top view of a semiconductor device in accordance with another embodiment of the present disclosure.

FIG. 2 is a top view of a semiconductor device 200 in accordance with another embodiment of the present disclosure. Referring to FIG. 2, the semiconductor device 200 is similar to the semiconductor device 101 described and illustrated with reference to FIG. 1A except that, for example, a doped region 221 of FIG. 2 is formed along a second junction 137 rather than the first junction 135.

In the embodiment of FIG. 2, the doped region 221 is disposed along the second junction 137 between the device channel 133 and the second isolation structure 138 in the direction from the source region 132 to the drain region 134. The doped region 221 overlaps both of the device channel 133 and the second isolation structure 138. In some embodiments, the doped region 221 may only overlap the device channel 133. The doped region 221 is separated from the source region 132 and the drain region 134, and thus overlaps neither the source region 132 nor the drain region 134.

In another embodiment, the doped region 221 disposed along the second junction 137 overlaps the drain region 134, and is separated from the source region 132. In yet another embodiment, the doped region 221 disposed along the second junction 137 overlaps the source region 132, and is separated from the drain region 134.

Similarly, like the doped region 121, the doped region 221 alleviates the problem of current fluctuation, and may cause fewer defects.

Figure 3B:
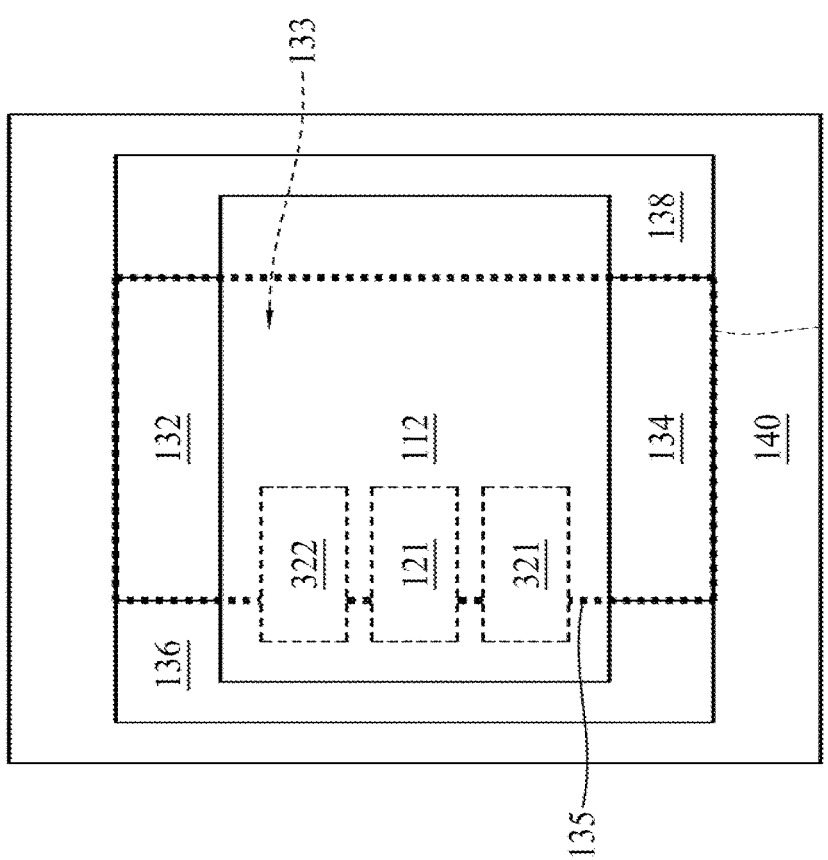
FIG. 3B is a top view of a semiconductor device in accordance with another embodiment of the present disclosure.
Figure 3A:
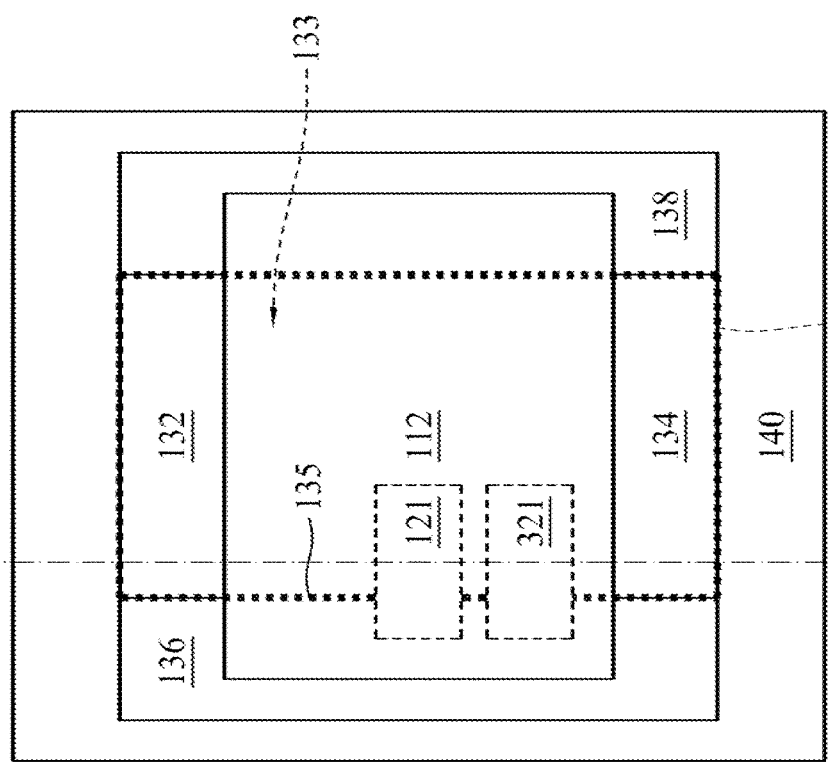
FIG. 3A is a top view of a semiconductor device in accordance with an embodiment of the present disclosure.

FIG. 3A is a top view of a semiconductor device 301 in accordance with an embodiment of the present disclosure. Referring to FIG. 3A, the semiconductor device 301 is similar to the semiconductor device 101 described and illustrated with reference to FIG. 1A except that, for example, a second doped region 321 separated from the first doped region 121 is added.

In the embodiment of FIG. 3A, the second doped region 321 is disposed along the first junction 135 between the device channel 133 and the first isolation structure 136 in the direction from the source region 132 to the drain region 134. The second doped region 321 overlaps both of the device channel 133 and the first isolation structure 136. In addition, the second doped region 321 is separated from the source region 132 and the drain region 134.

In another embodiment, the second doped region 321 may only overlap the device channel 133. In yet another embodiment, the second doped region 321 may overlap one of the source region 132 and the drain region 134. In still another embodiment, the second doped region 321 may be different from the first doped region 121 in size or shape. Simulation results show that two doped regions may be more effective to alleviate current fluctuation than a single doped region, which will be further discussed with reference to FIG. 15.

FIG. 3B is a top view of a semiconductor device 302 in accordance with another embodiment of the present disclosure. Referring to FIG. 3B, the semiconductor device 302 is similar to the semiconductor device 301 described and illustrated with reference to FIG. 3A except that, for example, a third doped region 322 separated from the first and second doped regions 121, 321 is added.

In the embodiment of FIG. 3B, the third doped region 322 is disposed along the first junction 135 between the device channel 133 and the first isolation structure 136 in the direction. In addition, the third doped region 322 overlaps both of the device channel 133 and the first isolation structure 136. Moreover, the third doped region 322 is separated from the drain region 134 and the source region 132.

In another embodiment, the third doped region 322 may only overlap the device channel 133. In yet another embodiment, the third doped region 322 may overlap one of the source region 132 and the drain region 134. In still another embodiment, the third doped region 322 may be different from at least one of the first doped region 121 or the second doped region 321 in size or shape. Simulation results show that three doped regions may be more effective to alleviate current fluctuation than two doped regions, which will be further discussed with reference to FIG. 15.

Figure 4B:
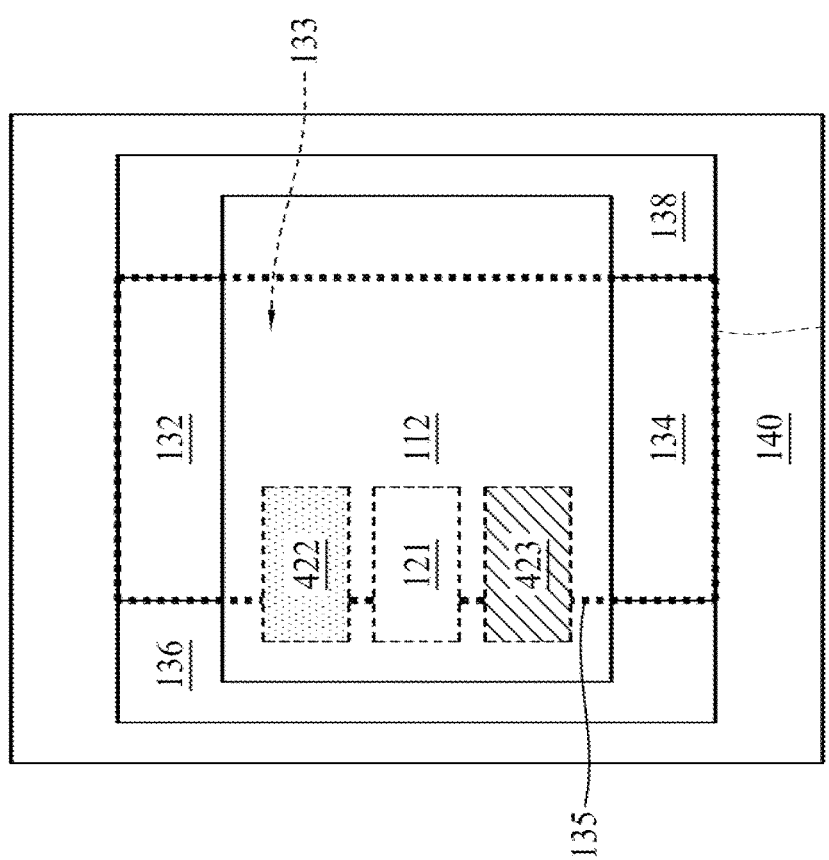
FIG. 4B is a top view of a semiconductor device in accordance with an embodiment of the present disclosure.
Figure 4A:
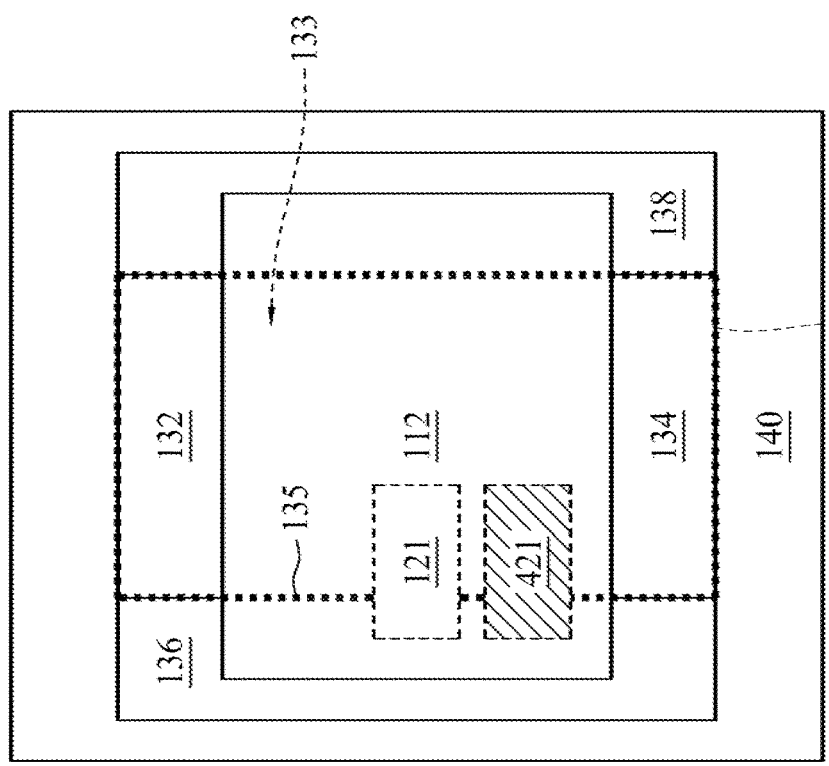
FIG. 4A is a top view of a semiconductor device in accordance with an embodiment of the present disclosure.

FIG. 4A is a top view of a semiconductor device 401 in accordance with an embodiment of the present disclosure. Referring to FIG. 4A, the semiconductor device 401 is similar to the semiconductor device 301 described and illustrated with reference to FIG. 3A except that, for example, the dopant composition of the first doped region 121 is different from that of a second doped region 421. For example, for an n-type semiconductor device 301, the first doped region 121 may include boron while the second doped region 421 may include boron difluoride, or vice versa. Moreover, for a p-type semiconductor device 301, the first doped region 121 may include arsenic while the second doped region 421 may include phosphorus, or vice versa.

In the embodiment of FIG. 4A, the first doped region 121 and the second doped regions 421 may be formed by implanting with different recipes, including different operations. As a result, the first doped region 121 and the second doped regions 421 may include different compositions, different implanting concentrations, or different implanting gradients.

FIG. 4B is a top view of a semiconductor device 402 in accordance with an embodiment of the present disclosure. Referring to FIG. 4B, the semiconductor device 402 is similar to the semiconductor device 302 described and illustrated with reference to FIG. 3B except that, for example, the compositions of the first doped region 121, the second doped region 422, and the third doped region 423 are different from each other.

Similarly, the first doped region 121, the second doped regions 422, and the third doped regions 423 may be formed by implanting with different recipes, and thus may include different compositions, implanting concentrations, or implanting gradients.

Figure 5:
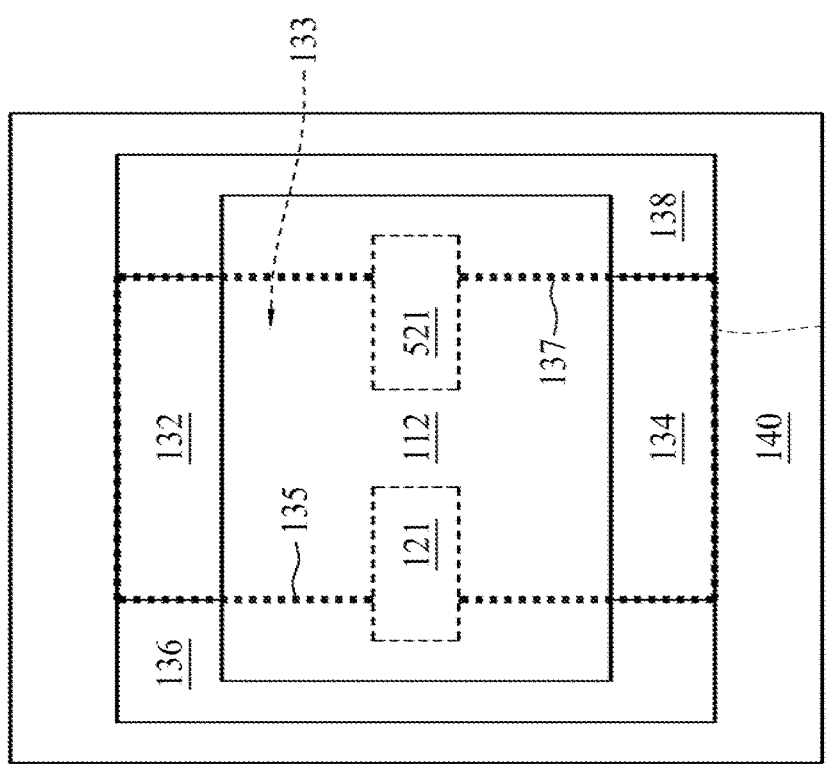
FIG. 5 is a top view of a semiconductor device in accordance with another embodiment of the present disclosure.

FIG. 5 is a top view of a semiconductor device 500 in accordance with another embodiment of the present disclosure. Referring to FIG. 5, the semiconductor device 500 is similar to the semiconductor device 101 described and illustrated with reference to FIG. 1A except that, for example, a second doped region 521 is added.

In the embodiment of FIG. 5, the second doped region 521 is disposed along the second junction 137 between the device channel 133 and the second isolation structure 138 in the direction from the source region 132 to the drain region 134. The second doped region 521 overlaps both of the device channel 133 and the second isolation structure 138. In addition, the second doped region 521 is separated from the source region 132 and the drain region 134, and thus overlaps neither the source region 132 nor the drain region 134.

In another embodiment, the second doped region 521 may only overlap the device channel 133. In still another embodiment, the second doped region 521 overlaps the drain region 134, and is separated from the source region 132. In yet another embodiment, the second doped region 521 overlaps the source region 132, and is separated from the drain region 134. In yet still another embodiment, the second doped region 521 may be different from the first doped region 121 in shape or size. In still yet another embodiment, the second doped region 521 may be different from the first doped region 121 in compositions.

Figure 6:
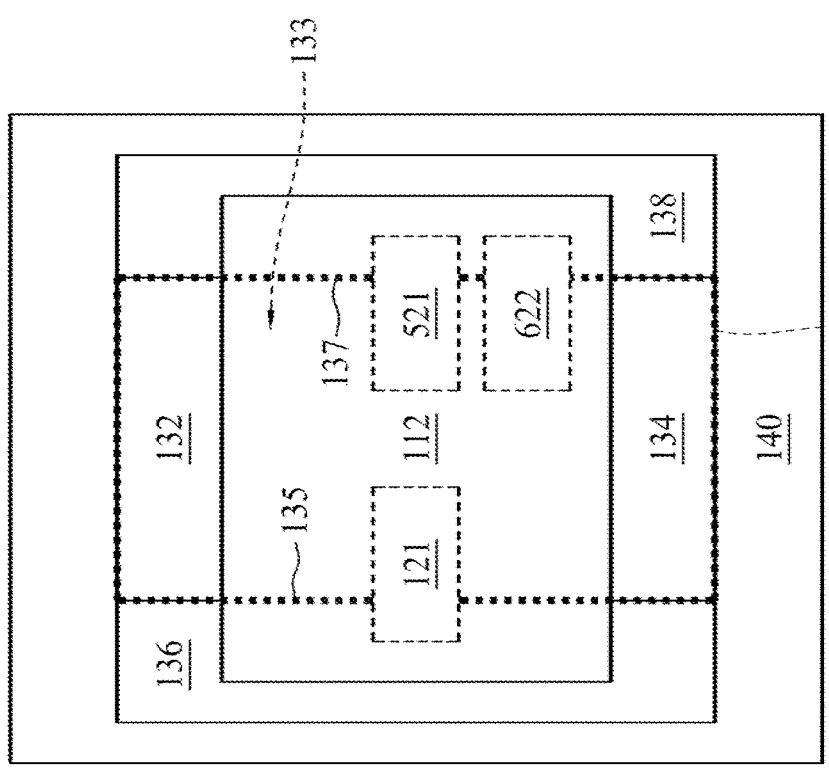
FIG. 6 is a top view of a semiconductor device in accordance with another embodiment of the present disclosure.

FIG. 6 is a top view of a semiconductor device 600 in accordance with another embodiment of the present disclosure. Referring to FIG. 6, the semiconductor device 600 is similar to the semiconductor device 500 described and illustrated with reference to FIG. 5 except that, for example, a third doped region 622 separated from the second doped region 521 is added. Thus, the amounts of the doped regions 121, 521, 622 along the first and second junction 135, 137 are different.

In the embodiment of FIG. 6, the third doped region 622 is disposed along the second junction 137 between the device channel 133 and the second isolation structure 138 in the direction from the source region 132 to the drain region 134. The third doped region 622 overlaps both of the device channel 133 and the first isolation structure 136. In addition, the third doped region 622 is separated from the source region 132 and the drain region 134.

In another embodiment, the third doped region 622 may only overlap the device channel 133. In yet another embodiment, the third doped region 622 overlaps the drain region 134, and is separated from the source region 132. In still another embodiment, the third doped region 622 overlaps the source region 132, and is separated from the drain region 134. In yet still another embodiment, the third doped region 622 may be different from the second doped region 521 in shape or size. In still yet another embodiment, the third doped region 622 may be different from the second doped region 521 in compositions.

Figure 7:
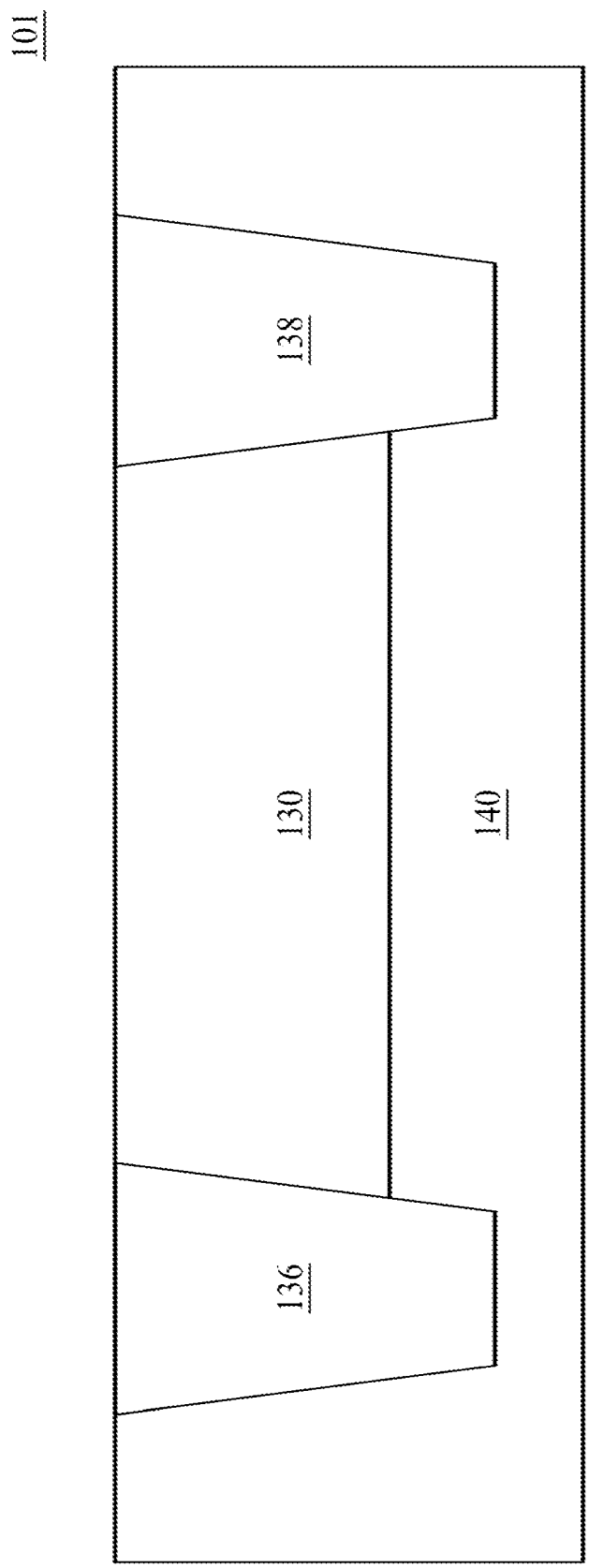
FIGS. 7 to 12 are cross-sectional views showing a method of forming the semiconductor device shown in FIG. 1A, in accordance with some embodiments.

FIGS. 7 to 11 are cross-sectional views showing a method of forming a semiconductor device 101 shown in FIG. 1A. Referring to FIG. 7, a cross-sectional view taken along a line LL in FIG. 1A, a substrate 140 is provided. In some embodiments, the substrate 140 includes a silicon substrate or a silicon wafer. In some embodiments, the substrate 140 includes silicon, germanium, gallium arsenide or other suitable materials. In some embodiments, the substrate 140 is a single crystalline or polycrystalline silicon substrate. In some embodiments, the substrate 140 includes several conductive structures, electrical components, etc.

Next, a first isolation structure 136 and a second isolation structure 138 are formed in the substrate 140. Suitable materials for the first isolation structure 136 and the second isolation structure 138 include dielectric materials, for example, silicon dioxide. A source/drain diffusion area 130 in the substrate 140 is defined by the first isolation structure 136 and the second isolation structure 138.

Figure 8:
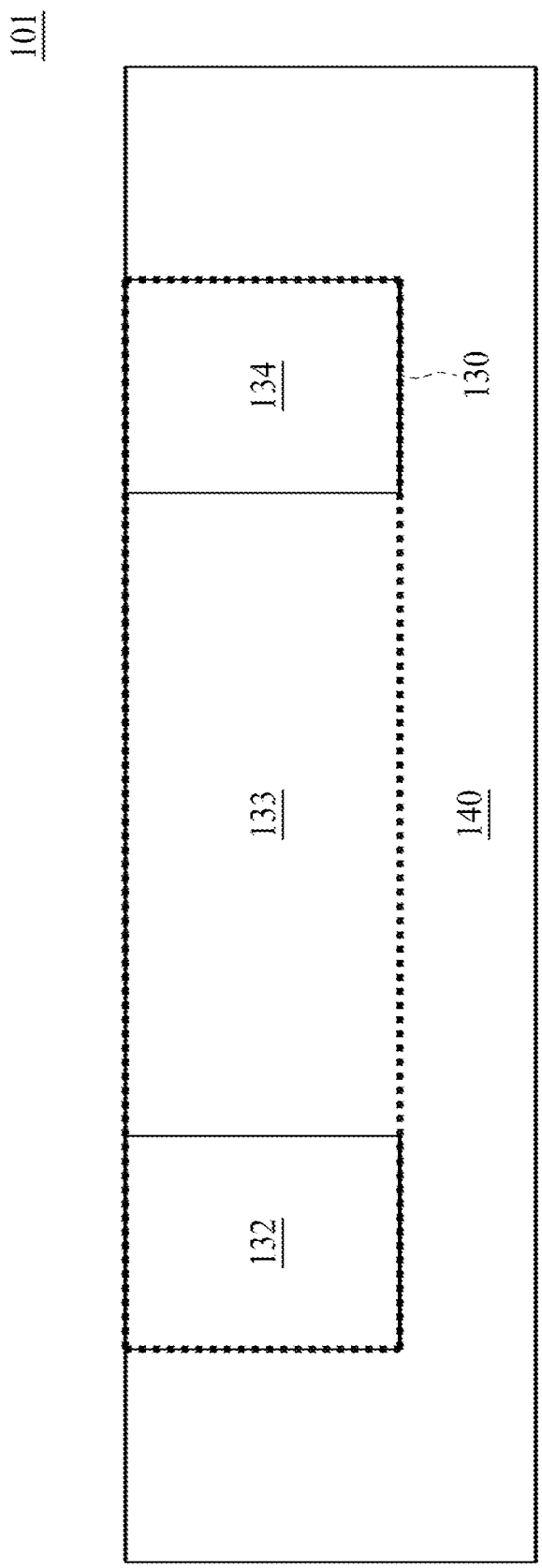

Referring to FIG. 8, a cross-sectional view taken along a line AA in FIG. 1A, an active area including a source region 132, a drain region 134 and a device channel 133 are formed in the source/drain diffusion area 130. Further, a device channel 133 is formed between the source region 132 and the drain region 134.

Figure 9:
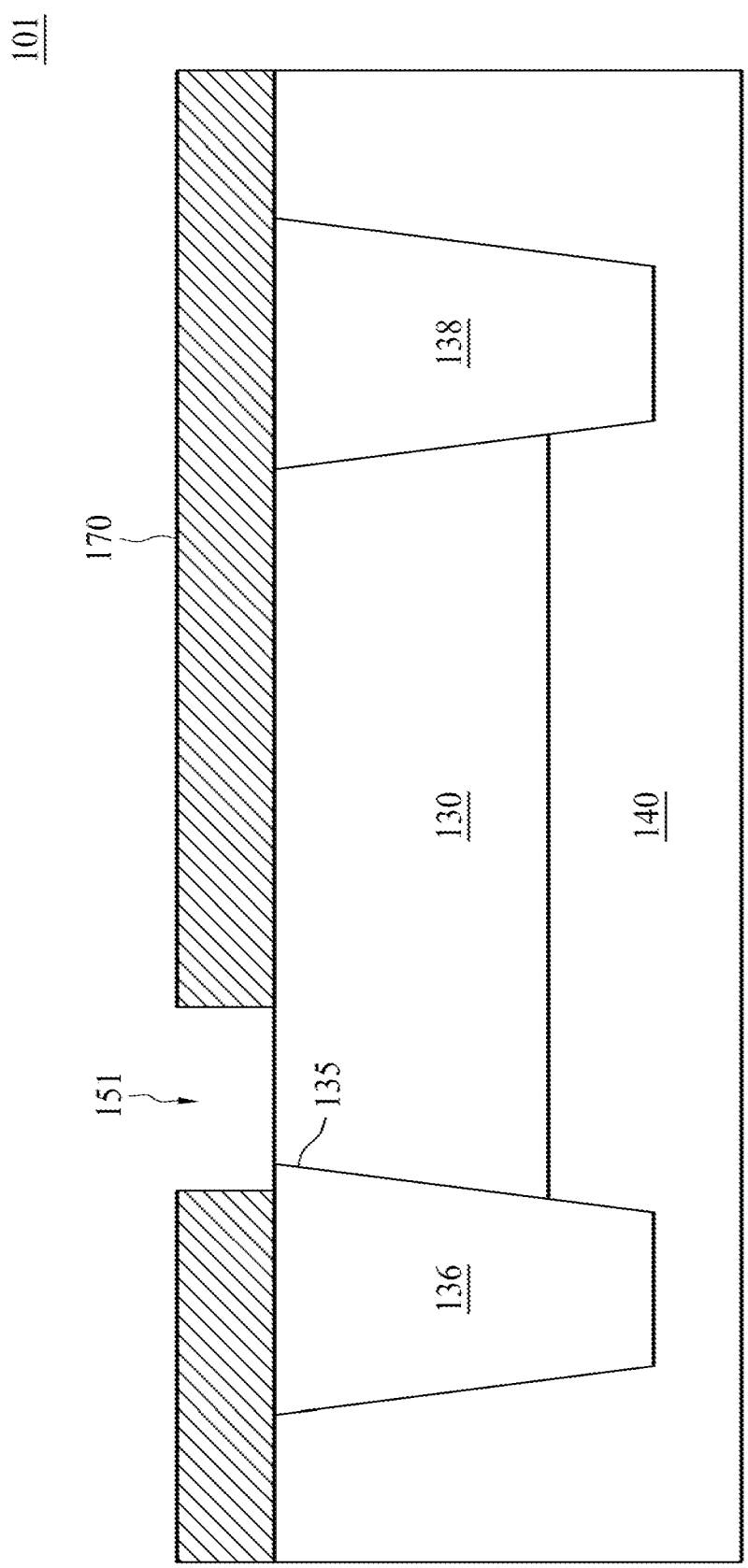

Referring to FIG. 9, a patterned masking layer 170 is formed on the source/drain diffusion area 130 by, for example, a spin coating process. The patterned masking layer 170 may include a thin coating of masking material that absorbs light to varying degrees and can be patterned with a custom design. Suitable materials for the masking layer 170 include polyimide. The patterned masking layer 170 exposes a first junction 135 between the source/drain diffusion area 130 and the first isolation structures 136 through a first opening 151. The first opening 151 is formed along the first junction 135 in a direction from the source region 132 towards the drain region 134. The first opening 151 unexposes at least one of the source region 132 and the drain region 135.

Figure 10:
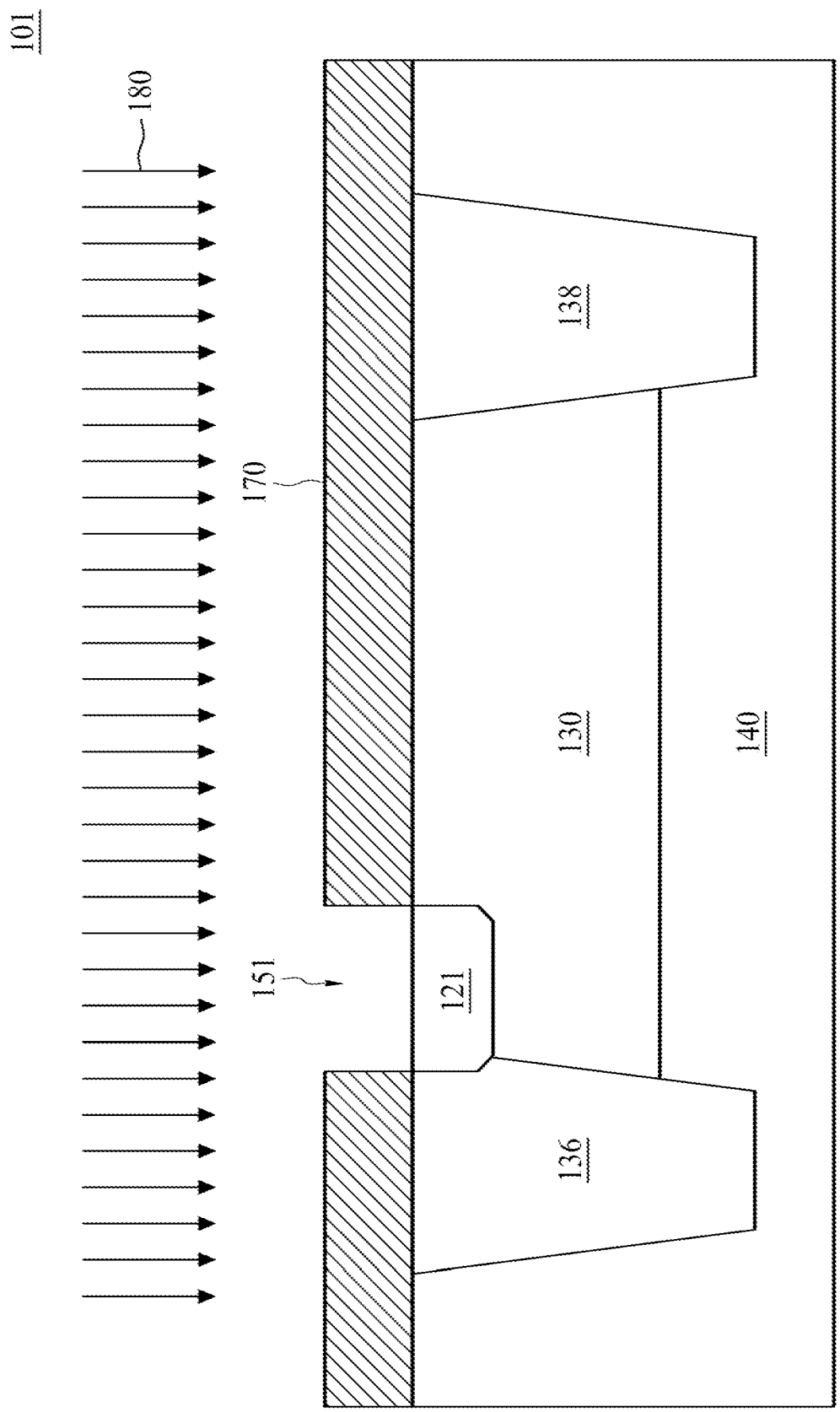

Referring to FIG. 10, a first doped region 121 is formed by implanting the first junction 135 through the first opening 151 in an implanted process 180 using, for example, p-type dopants for an n-type semiconductor device 101, or n-type dopants for a p-type semiconductor device 101. In an embodiment, p-type dopants such as boron or boron difluoride ($BF_2$) having a concentration of 1e17-1e19/cm$^3$ are implanted to approximately 0 to 101 nm depth. In another embodiment, n-type dopants such as arsenic, phosphorus, or antimony having a concentration of 1e17-1e19/cm$^3$ are implanted to approximately 0 to 101 nm depth. The first doped region 121 has a dopant concentration higher than that of the device channel 133.

Figure 11:
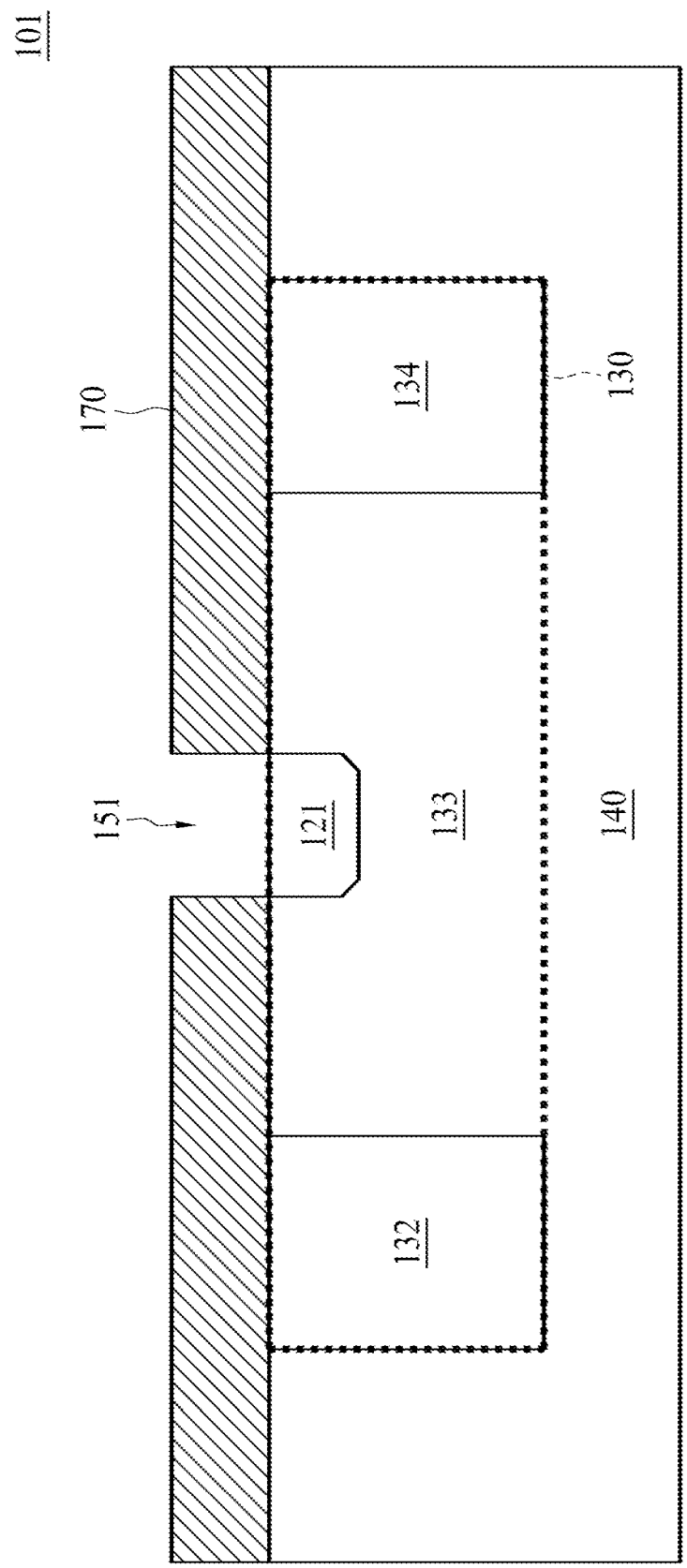

FIG. 11 illustrates a cross-sectional view, taken along the line AA, when the first doped region 121 is formed. After the first doped region 121 is formed, the patterned masking layer 170 is removed.

Figure 12:
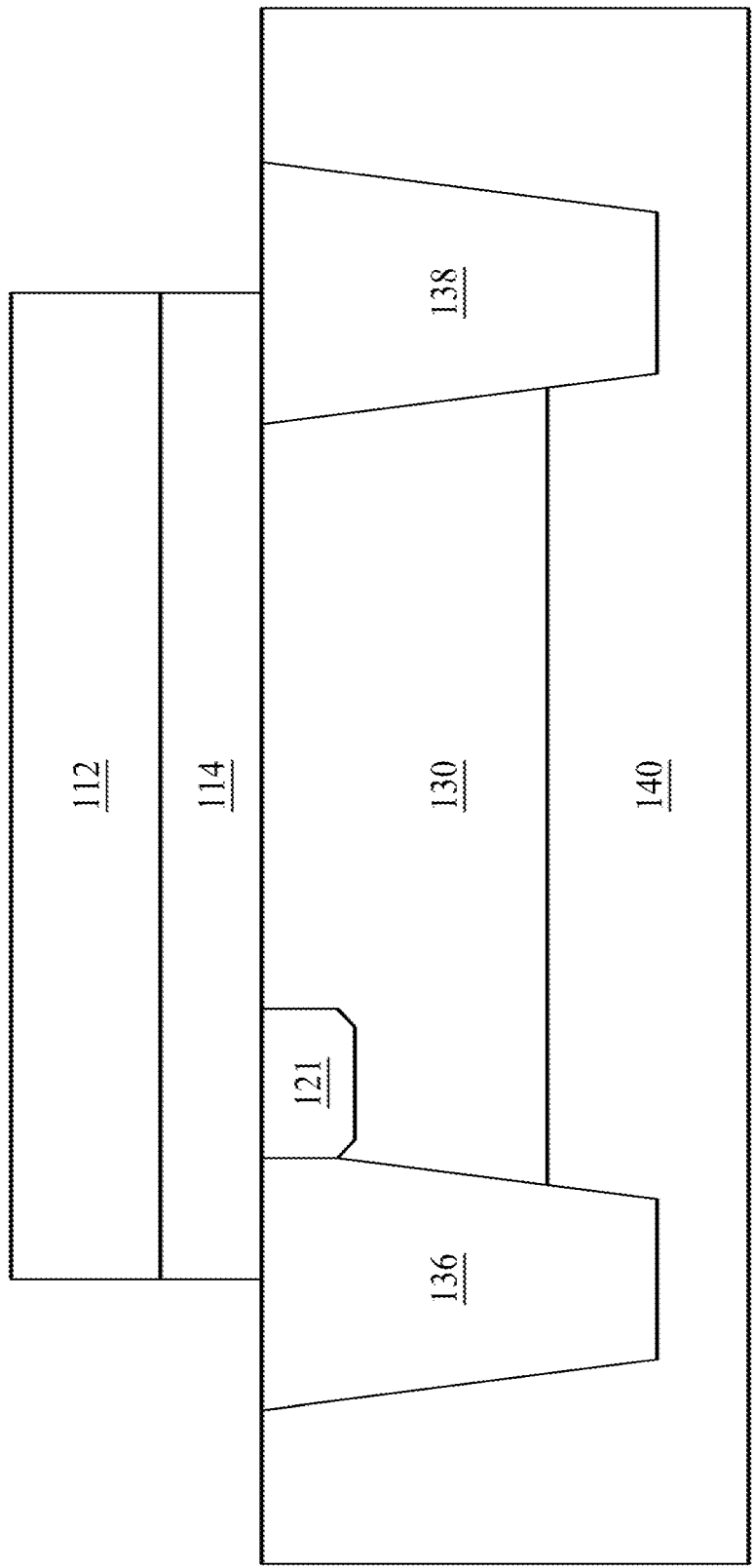

Referring to FIG. 12, a gate dielectric layer 114 is formed on the source/drain diffusion area 130. Suitable materials for the gate dielectric layer 114 include dielectric materials, for example, silicon dioxide. Subsequently, a gate 112 is formed on the gate dielectric layer 114, resulting in the semiconductor device 101 of FIG. 1A. Suitable materials for the gate 112 include polycrystalline silicon or metal, for example, tungsten, aluminum and copper.

In the embodiments shown in FIGS. 7 to 12, an implanting process is used to form the first doped region 121. In other embodiments, the first doped region 121 may be formed by one or more doping processes that result in the fact that the first doped region 121 has a dopant concentration higher than that of the device channel 133.

Figure 13A:
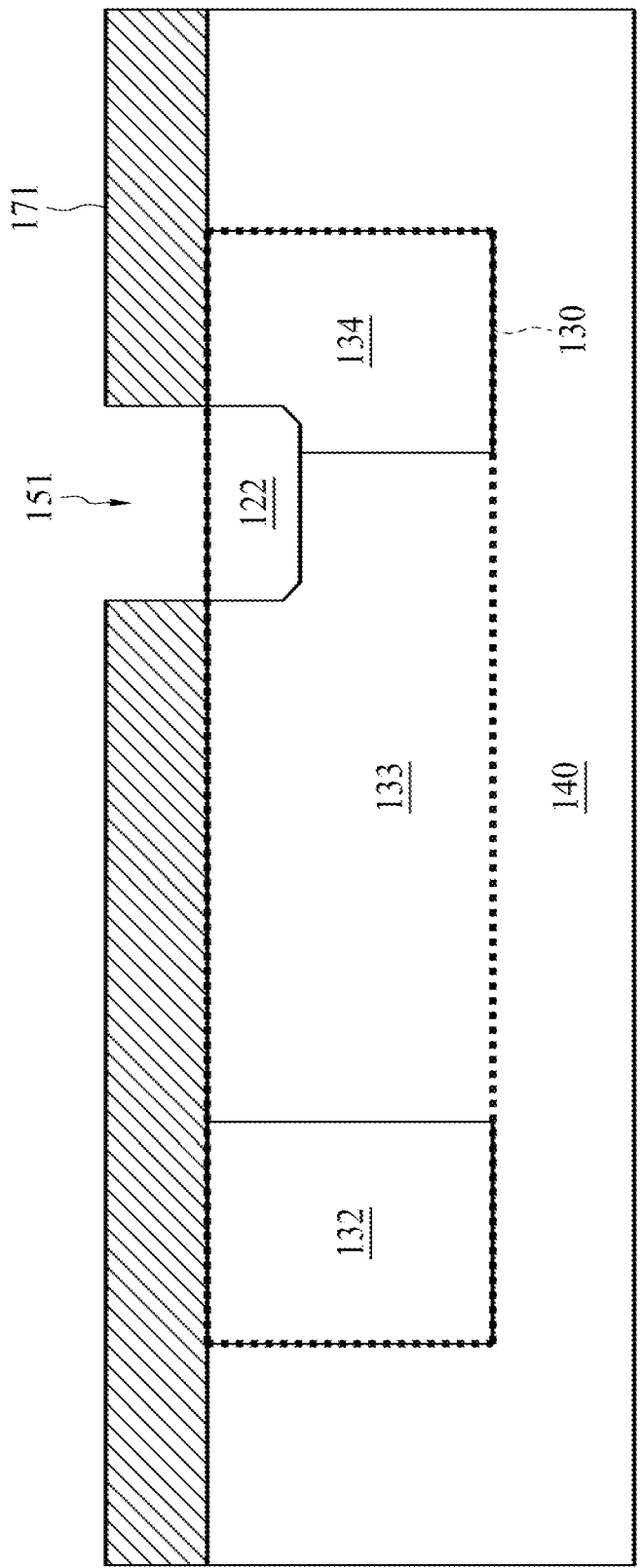
FIG. 13A is a cross-sectional view showing a method of forming the semiconductor device shown in FIG. 1B, in accordance with some embodiments.

FIG. 13A is a cross-sectional view showing a method of forming the semiconductor device 102 shown in FIG. 1B taken along a line BB, in accordance with some embodiments. As previously discussed, the semiconductor device 102 is similar to the semiconductor device 101 described and illustrated with reference to FIG. 1A except the position of the doped region 122. In the present embodiment, by adjusting the patterned masking layer 170 shown in FIG. 9, the position of the first opening 151 is relocated. As a result, a portion of the first junction 135 where the doped region 122 is to be formed is exposed through the relocated first opening 151. In another embodiment, the patterned masking layer 170 is adjusted to facilitate forming the doped region 122 with a different size or shape. In still another embodiment, the patterned masking layer 170 is adjusted to facilitate forming another doped region separated from the doped region 122.

Figure 13B:
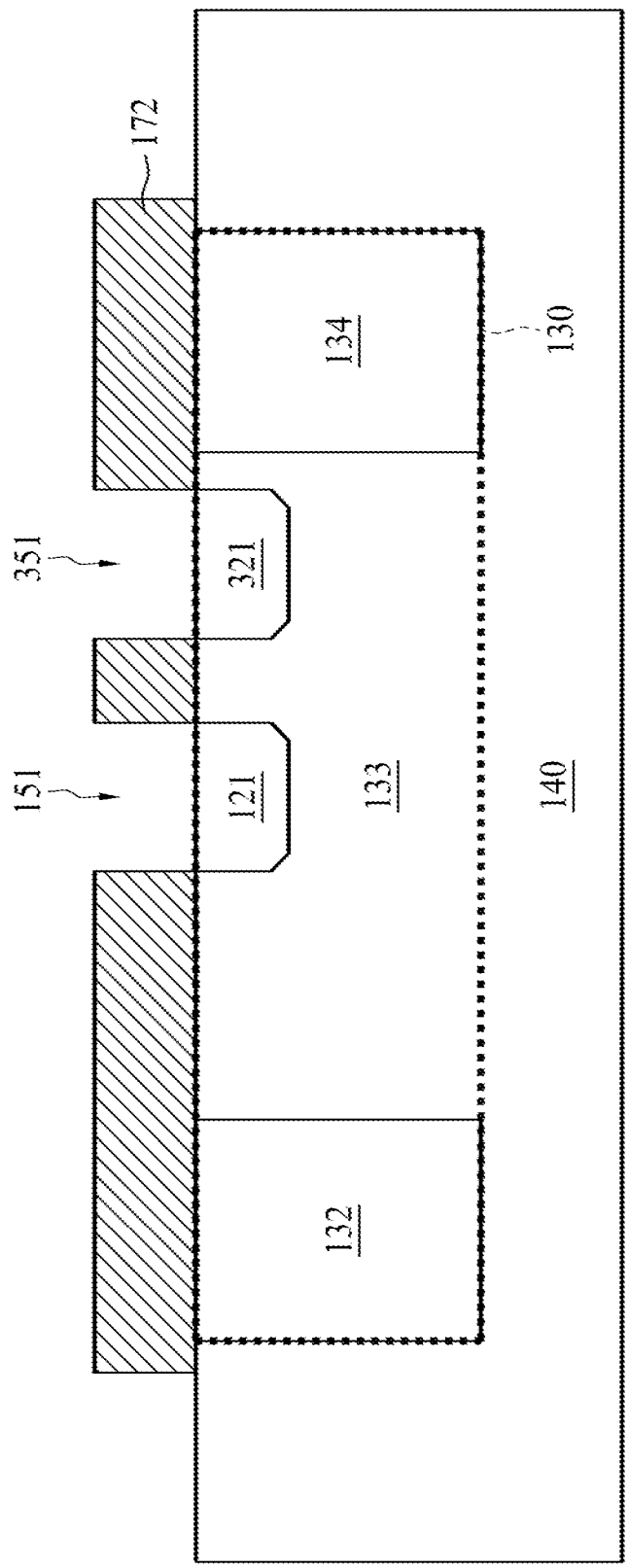
FIG. 13B is a cross-sectional view showing a method of forming the semiconductor device shown in FIG. 3A, in accordance with some embodiments.

FIG. 13B is a cross-sectional view showing a method of forming the semiconductor device shown in FIG. 3A, in accordance with some embodiments. Referring to FIG. 13B, the method is similar to that described and illustrated with reference to FIG. 11 except that, for example, a patterned masking layer 172 is designed with a second opening 351 in addition to the first opening 151. The second opening 351 is separated from first opening 151. In the present embodiment, the first opening 151 and the second opening 351 are formed between the source region 132 and the drain region 134. As a result, the first doped region 121 and the second doped region 321 subsequently formed through the first opening 151 and the second opening 351, respectively, are separated from the source region 132 and the drain region 134. In another embodiment, one of the first opening 151 and the second opening 351 may expose one of the source region 132 and the drain region 134. As a result, the one of the first doped region 121 and the second doped region 321 subsequently formed through the first opening 151 and the second opening 351, respectively, may overlap the one of the source region 132 and the drain region 134. In the present embodiment, two doped regions 121 and 321 are formed. In other embodiments, three or more doped regions separated from each other may be formed. At least one of these doped regions may be different from the other in size or shape. Moreover, at least one of these doped regions may include different compositions, different implanting concentrations or different implanting gradients.

Figure 14:
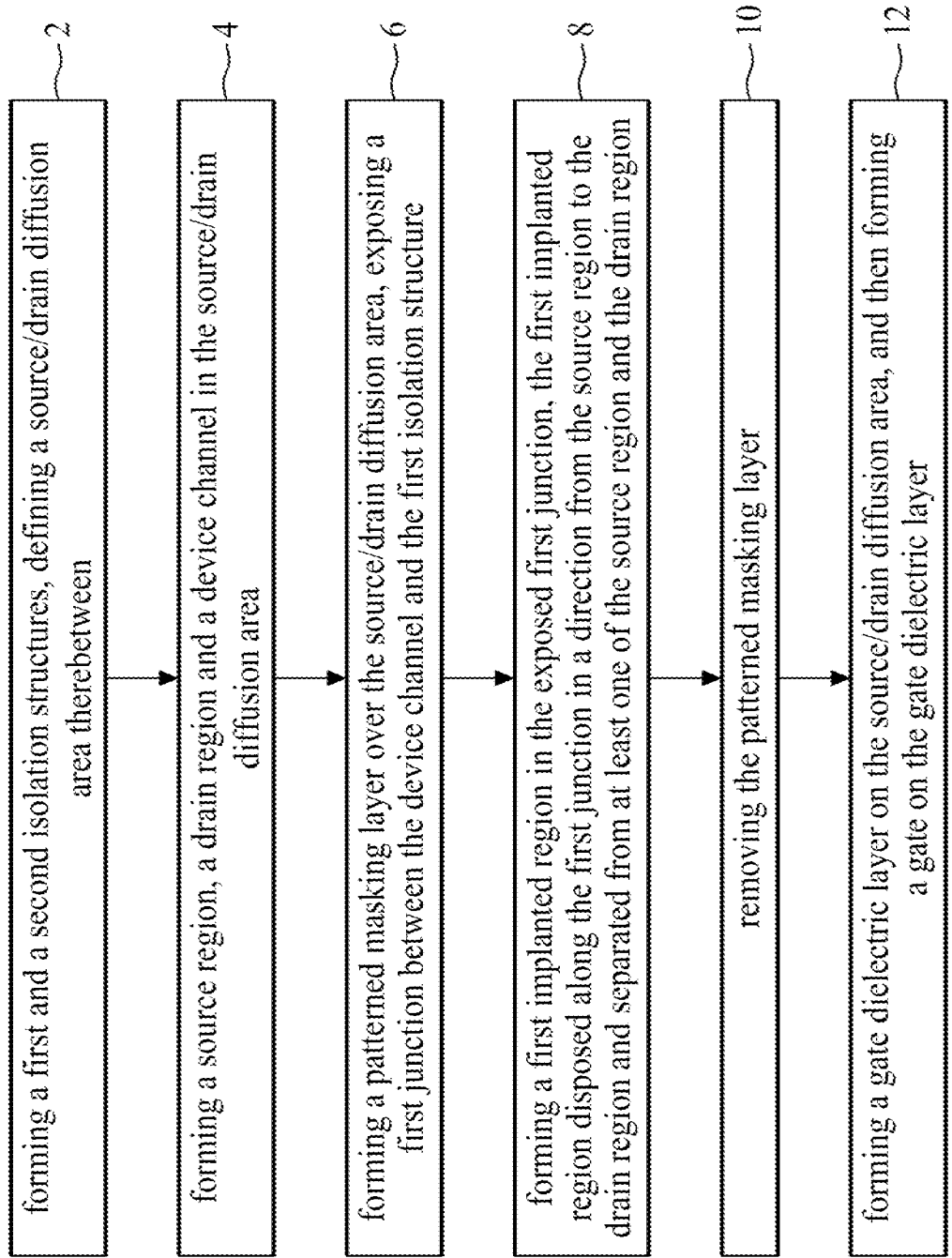
FIG. 14 is a flow diagram of a method for manufacturing a semiconductor device, in accordance with some embodiments of the present disclosure.

FIG. 14 is a flow diagram of a method for manufacturing a semiconductor device in accordance with some embodiments of the present disclosure.

Referring to FIG. 14, in operation 2, a first isolation structure 136 and a second isolation structure 138 are formed in a substrate 140. The first isolation structure 136 and the second isolation structure 138 are separated from each other and define a source/drain diffusion area 130 therebetween.

In operation 4, a source region 132, a drain region 134 and a device channel 133 are formed in the source/drain diffusion area 130.

Next, in operation 6, a patterned masking layer 170 is formed over the source/drain diffusion area 130, exposing a first junction 135 between the device channel 133 and the first isolation structure 136. In an embodiment, the patterned masking layer 170 exposes more than one areas separated from each other in the first junction 135. In another embodiment, the patterned masking layer 170 also exposes a second junction 137 between the device channel 133 and the second isolation structure 138.

In operation 8, a first doped region 121 is formed in the exposed first junction 135. The first doped region 121 is disposed along the first junction 135 in a direction from the source region 132 to the drain region 134 and is separated from at least one of the source region 132 and the drain region 134. In the case that the patterned masking layer 170 also exposes the second junction 137, a second doped region 221 is formed in the exposed second junction 137. The second doped region 221 is disposed along the second junction 137 in the direction from the source region 132 to the drain region 134 and is separated from at least one of the source region 132 and the drain region 134. The patterned masking layer 170 is then removed in operation 10.

Subsequently, in operation 12, a gate dielectric layer 114 is formed on the source/drain diffusion area 130. Afterwards, a gate 112 is formed on the gate dielectric layer 114.

Figure 15:
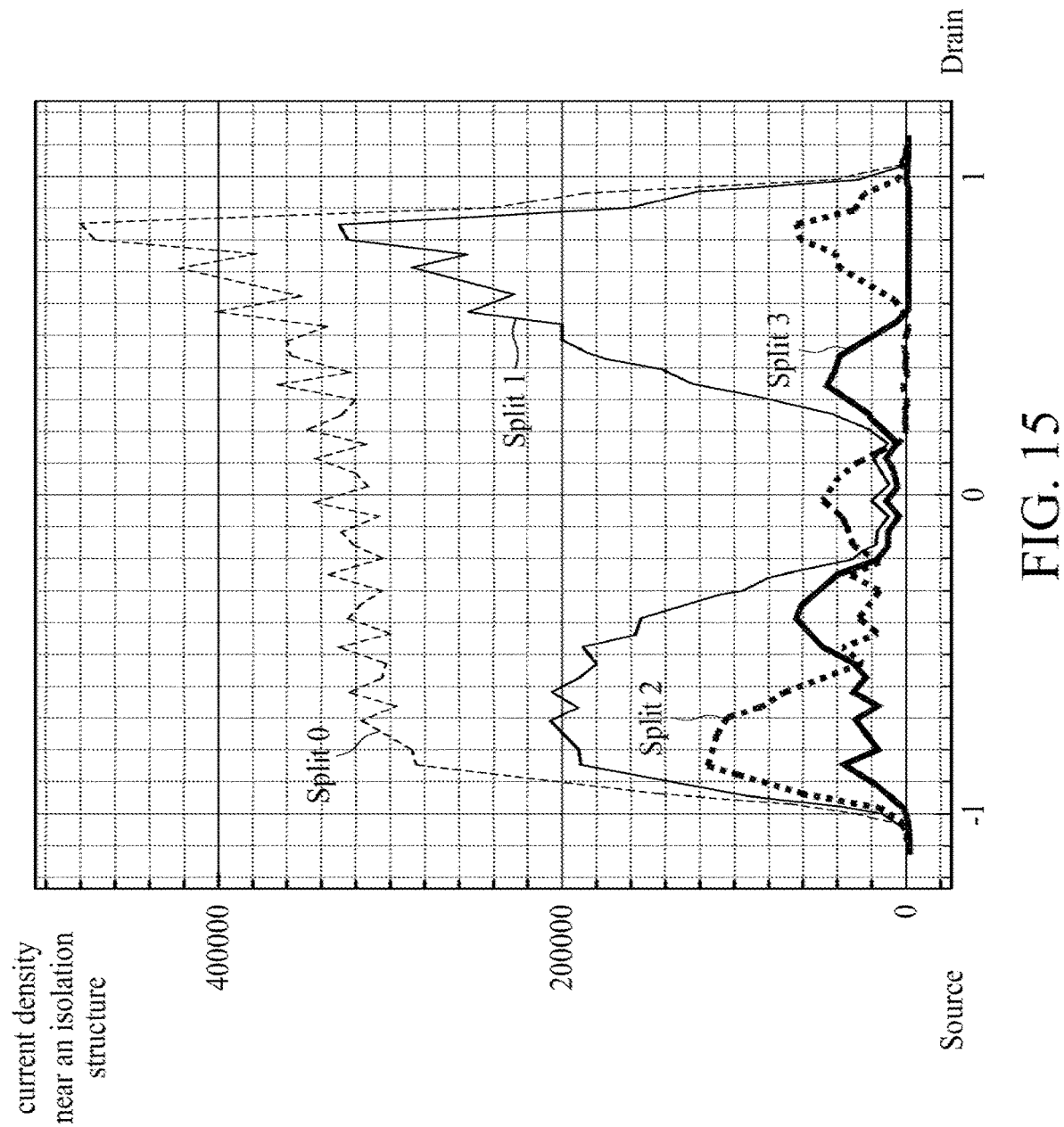
FIG. 15 is a chart illustrating current density distributions from a source region to a drain region.

FIG. 15 is a chart illustrating current density distributions near isolation structures from a source region to a drain region. Referring to FIG. 15, the X coordinate represents the positions along the junctions between an isolation structure and a device channel from the source region to the drain region. The Y coordinate represents current densities.

A curve labeled "Split 0" represents a simulation result of a semiconductor device with no doped region in the junction between the device channel and the isolation structure. A curve labeled "Split 1" represents a simulation result of a semiconductor device with one doped region in the junction. A curve labeled "Split 2" represents a simulation result of a semiconductor device with two doped regions in the junction. A curve labeled "Split 3" represents a simulation result of a semiconductor device with three doped regions in the junction.

The simulation results demonstrate that, averagely speaking, current density is reduced as the number of doped regions increases. For example, the curve "Split 3" indicates that the semiconductor device with three doped regions has a better performance than the others.

The present disclosure provides a semiconductor device comprising a source/drain diffusion area, and a first doped region. The source/drain diffusion area is defined between a first isolation structure and a second isolation structure. The source/drain diffusion area includes a source region, a drain region, and a device channel. The device channel is between the source region and the drain region. The first doped region is disposed along a first junction between the device channel and the first isolation structure in a direction from the source region to the drain region. The first doped region is separated from at least one of the source region and the drain region, and has a dopant concentration higher than that of the device channel.

The present disclosure provides a semiconductor device comprising a source/drain diffusion area and a plurality of first doped regions. The source/drain diffusion area is defined between a first isolation structure and a second isolation structure. The source/drain diffusion area includes a source region, a drain region, and a device channel between the source region and the drain region. The first doped regions are disposed along a first junction between the device channel and the first isolation structure in a direction from the source region to the drain region. The first doped regions are separated from each other, and have a dopant concentration higher than that of the device channel.

The present disclosure provides a method for manufacturing a semiconductor device comprising: forming a first isolation structure and a second isolation structure; forming a source/drain diffusion area between the first and second isolation structures; forming a masking layer over the device channel; patterning the masking layer to form a first opening exposing a first junction between the device channel and the first isolation structure, wherein the first opening is disposed along the first junction in a direction from the source region to the drain region, and unexposes at least one of the source region and the drain region; and implanting the first junction through the first opening to form a first doped region. The source/drain diffusion area includes: a source region; a drain region; and a device channel between the source region and the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a source/drain diffusion area, defined between a first isolation structure and a second isolation structure, including:
a source region;
a drain region; and
a device channel between the source region and the drain region;
and
a first doped region disposed along a first junction between the device channel and the first isolation structure in a direction from the source region to the drain region, the first doped region being formed between the source region and the drain region, and separated from each of the source region and the drain region,
wherein the first doped region has a dopant concentration higher than that of the device channel.

2. The semiconductor device according to claim 1, further comprising a second doped region disposed along the first junction, the second doped region being separated from the first doped region.

3. The semiconductor device according to claim 2, wherein the second doped region overlaps one of the source region and the drain region.

4. The semiconductor device according to claim 2, wherein the second doped region is separated from each of the source region and the drain region.

5. The semiconductor device according to claim 2, wherein the second doped region is different in size, shape or composition from the first doped region.

6. The semiconductor device according to claim 1, further comprising a second doped region disposed along a second junction between the device channel and the second isolation structure in the direction from the source region to the drain region, wherein the second doped region is separated from at least one of the source region and the drain region.

7. The semiconductor device according to claim 6, further comprising a third doped region disposed along the second junction in the direction from the source region to the drain region, wherein the third doped region is separated from at least one of the source region and the drain region.

8. A semiconductor device, comprising:
a source/drain diffusion area, defined between a first isolation structure and a second isolation structure, including:
a source region;
a drain region; and
a device channel between the source region and the drain region;
a plurality of first doped regions disposed along a first junction between the device channel and the first isolation structure in a direction from the source region to the drain region, wherein one of the first doped regions is separated from each of the source region and the drain region, and another of the first doped regions separated from the one of the first doped regions has a dopant concentration higher than that of the device channel.

9. The semiconductor device according to claim 8, wherein the another of the first doped regions overlaps one of the source region and the drain region.

10. The semiconductor device according to claim 8, further comprising a gate disposed over the source/drain diffusion area, wherein each of the first doped regions is located within a projected area of the gate onto the source/drain diffusion area, the first isolation structure and the second isolation structure.

11. The semiconductor device according to claim 8, wherein the one the first doped regions is different in size, shape or composition from the another of the first doped regions.

12. The semiconductor device according to claim 8, further comprising a second doped region disposed along a second junction between the device channel and the second isolation structure in the direction from the source region to the drain region.

13. The semiconductor device according to claim 12, wherein the second doped region is separated from at least one of the source region and the drain region.

14. The semiconductor device according to claim 12, wherein the second doped region is different in size, shape or composition from the first doped regions.

15. The semiconductor device according to claim 12, wherein a position of the second doped region and a position of the one of the first doped regions are symmetrical with respect to the device channel.

16. The semiconductor device according to claim 12, further comprising a third doped region disposed along the second junction in the direction from the source region to the drain region, wherein the third doped region is separated from the second doped region.

17. A method for manufacturing a semiconductor device, the method comprising:
  forming a first isolation structure and a second isolation structure;
  forming a source/drain diffusion area between the first and second isolation structures, wherein the source/drain diffusion area includes:
    a source region;
    a drain region; and
    a device channel between the source region and the drain region;
  forming a masking layer over the device channel;
  patterning the masking layer to form a first opening exposing a first junction between the device channel and the first isolation structure, wherein the first opening is disposed along the first junction in a direction from the source region to the drain region, and unexposes each of the source region and the drain region; and
  implanting the first junction through the first opening to form a first doped region.

18. The method according to claim 17, further comprising:
  patterning the masking layer to form a second opening exposing the first junction, the second opening disposed along the first junction in the direction, and separated from the first opening; and
  implanting the first junction through the second opening to form a second junction doped region.

19. The method according to claim 17, further comprising:
  patterning the masking layer to form a second opening exposing a second junction between the device channel and the second isolation structure, the second opening disposed along the second junction; and
  implanting the second junction through the second opening to form a second junction doped region.

20. The method according to claim 19, wherein a position of the second doped region and a position of the one of the first doped regions are symmetrical with respect to the device channel.

* * * * *